United States Patent [19]

Brooks

[11] Patent Number: 5,017,862
[45] Date of Patent: May 21, 1991

[54] AIR-CORE METER HAVING IMPROVED BOBBIN DESIGN

[75] Inventor: Bradford L. Brooks, Hopkington, N.H.

[73] Assignee: Beede Electrical Instrument Co., Inc., Penacook, N.H.

[21] Appl. No.: 458,850

[22] Filed: Dec. 29, 1989

[51] Int. Cl.$^5$ .............................................. G01R 1/02
[52] U.S. Cl. .................................. 324/146; 324/144; 324/154 R; 324/125
[58] Field of Search .............. 324/125, 143, 144, 146, 324/147, 151 R, 151 A, 154 R, 154 PB, 156

[56] References Cited

U.S. PATENT DOCUMENTS 3,753,107  8/1973  Burgett et al. ...................... 324/146
4,758,784  7/1988  Baker et al. ........................ 324/146
4,906,919  3/1990  Sato et al. ........................... 324/154

Primary Examiner—Kenneth Wieder
Assistant Examiner—Jack B. Harvey
Attorney, Agent, or Firm—William B. Ritchie

[57] ABSTRACT

An air-core meter having a two-piece bobbin enclosing and surrounding a moveable magnet within a sealed cavity containing a damping fluid. The magnet is rotated about the axis of a supporting shaft by a plurality of orthogonally related windings disposed about the outer surface of the bobbin. The air-core meter provides improved and simplified assembly, improved reliability and reduced damage in routine operation and service through novel bearing design and bobbin structure. Furthermore, improved meter performance is provided by specific winding geometries and magnetic structure design.

3 Claims, 3 Drawing Sheets

AIR-CORE METER HAVING IMPROVED BOBBIN DESIGN

FIELD OF THE INVENTION

The present invention relates to meters, in particular air-core meters.

BACKGROUND OF THE INVENTION

Prior air-core meter designs included bobbin structures which have been constructed in the assumption that the volume of the meter is unlimited and that the resulting assembly process can be adapted to include as many process steps as necessary to provide an assembled air-core meter. However, the limitations imposed by reduced dimensioned structures is antagonistic to reduced assembly costs and reduced defects. Furthermore, mere scaling of the structure to provide a smaller meter is limited in effectiveness wherein the meter performance and assembly costs become unacceptable.

SUMMARY OF THE INVENTION

The air-core meter according to the present invention comprises a rotor mounted on a shaft pivotally retained within a two-piece bobbin which further includes an integral cavity therein surrounding the rotor and providing containment of a fluid which acts to damp the rotational motion of the rotor. The bobbin further includes posts spaced radially apart from the axis of the shaft at regular intervals about and parallel to the shaft providing an aperture between the posts and the front bearing which is adapted to receive a plurality of orthogonal windings to surround the enclosed magnet rotor. Each of the plurality of posts is adapted to receive a wire terminator providing mechanical support and attachment of the assembled meter movement to a related circuit board, as well as termination of the windings. Further features of the present invention include particular winding geometries and magnetic material and other structural configuration to provide an efficient, easily assembled reduced size air-core meter movement.

BRIEF DESCRIPTION OF THE DRAWING

These and other features will be further understood by reading the following detailed description when taken together with the drawing, wherein.

DETAILED DESCRIPTION OF THE INVENTION

Figure 1:
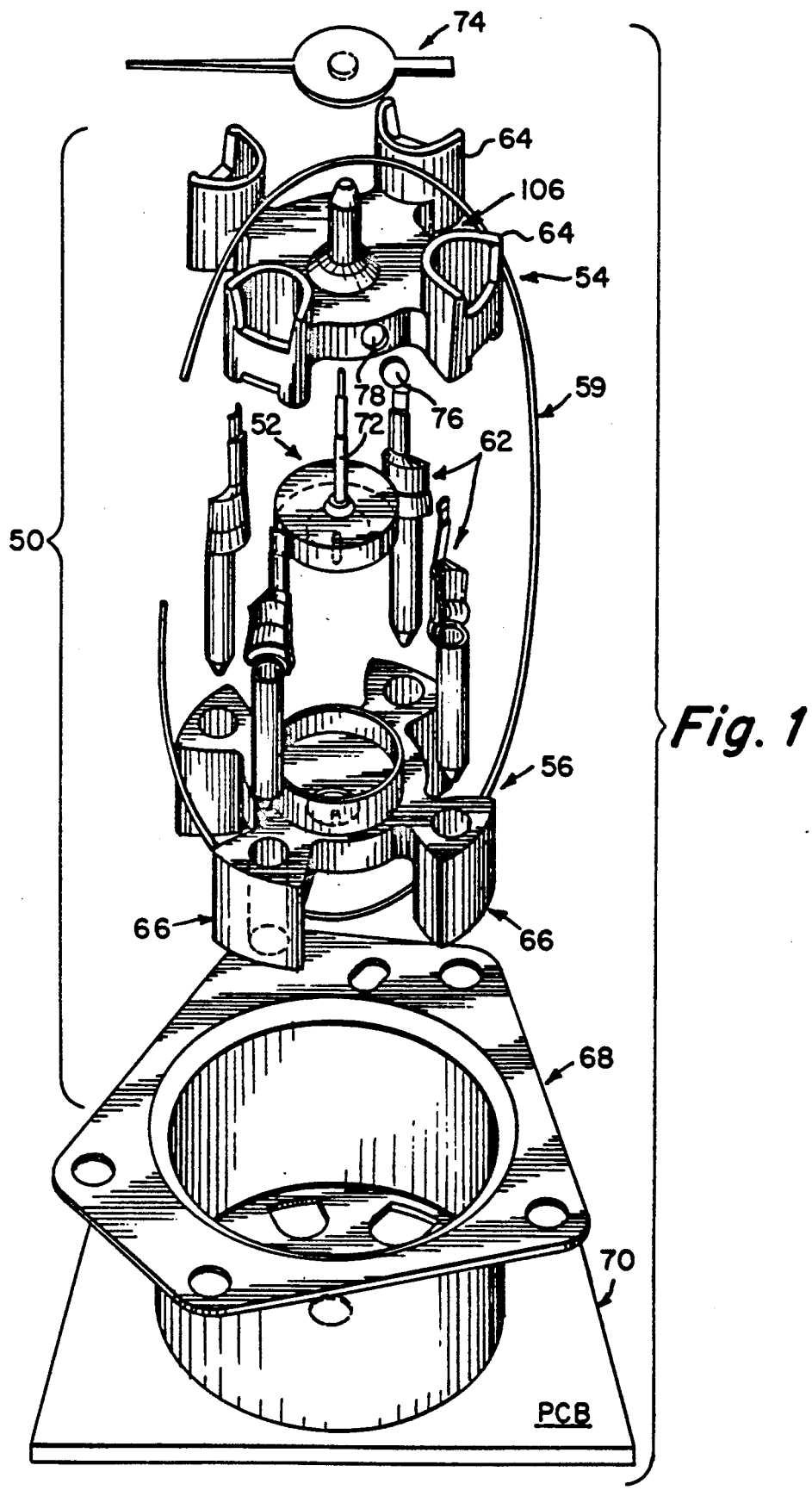
FIG. 1 is an exploded view showing the elements of one embodiment of the air-core meter according to the present invention.

The meter 50 according to one embodiment of the present invention is shown in exploded view in FIG. 1 wherein the rotor 52 is retained within a cavity formed by a bobbin top piece 54 and a bobbin bottom piece 56 and is adapted to receive orthogonal coils 58 and 60 thereon, and further comprises a plurality of metallic or conductive connecting pins 62 which are received within a similar plurality of posts 64 and 66 of the top and bottom pieces 54 and 56 respectively, to provide electrical termination of the coils 58 and 60 as well as to secure the assembled bobbin to a circuit card 70 through openings in a metallic outer housing 68. Circuitry (not shown) connected to the connector pins 62 via the circuit card 70 provide electrical energization of the coils 58 and 60 to impress a selectably variable magnetic field about a permanent magnet rotor which variable magnetic field thus induces a rotational torque about the rotor shaft 72. When connected to a pointer 74, the rotor 52 provides an angular pointer rotation corresponding to the energization received through the connector pins 62. Furthermore, in the embodiment illustrated, the rotor can be selectively urged to consistently return to a selected point by applying a magnetic field from an externally mounted magnet 76 of selected shape and orientation, e.g. circular or oblong, which may be located in one or more positions 78 about the periphery of the upper and/or lower bobbin pieces 54 and 56 between the posts 64 or within (not shown) the post 64.

Figure 2:
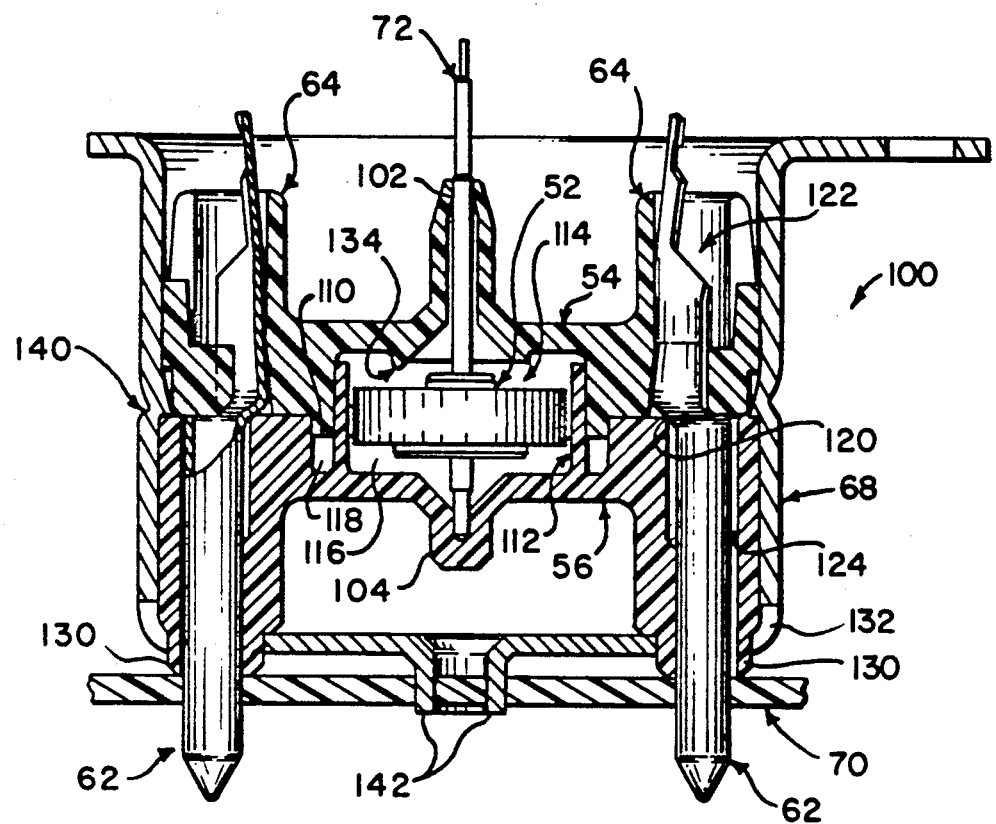
FIG. 2 is a cross-sectional view of an assembled meter according to one embodiment of the present invention.

A cross-sectional view 100 of the meter according to FIG. 1 is shown in FIG. 2 wherein the rotor 52 is retained by a top bearing 102 and a rear bearing 104 (of the upper and lower bobbin pieces 54 and 56) wherein the upper or top bearing extends beyond the planar surface of the upper bobbin piece (on which the coil windings are received) for a distance similar to the extension of the posts 64 creating a recess 106 therebetween to receive the coils 58 or 60 (of FIGS. 3 and 4) represented by single turn 59.

The top and bottom bobbin pieces 54 and 56 respectively include an axially extending circumferential cylindrical portion 110 and a circumferential cylindrical guide 112 which permit the top and bottom bobbin pieces to engage forming a fluid-tight cavity 114 therein having a silicone or other fluid 116 operable to damp the rotational motion of the rotor 52 about the axis of the shaft 72. The bottom piece of the bobbin 56 is provided with a circumferential recess 118 which receives the circumferential protrusion 110 of the top piece 54. Similarly, a circumferential guide 112 of the bottom piece engages the interior surface of the bobbin top piece 54, providing the fluid-tight interior cavity 114 and self-alignment of the front bearing 102 and the rear support bearing 104. The metallic pins 62 providing electrical connection between the windings and the circuit card 70 (as illustrated in FIG. 1 are received through the upper bobbin 54) aperture 122 and lower bobbin 56 axially extending aperture 124, being offset to permit a shoulder portion 126 of the posts to seat against a surface of the bottom piece 56 of the bobbin. The pins 62 extend downward through the lower piece 56 of the bobbin through an insulation extension 130 which passes through an aperture 132 of the housing 68. Each pin 62 is then received and physically and/or electrically connected to the circuit card 70.

The rotor 52 is actually retained by the rear support bearing 104 and by an axial protrusion 134 extending rearward towards the support bearing 104 from the top piece 54 of the bobbin. In particular the embodiment of the present invention shown in the drawing is provided with three such axial protrusions 134 regularly spaced at 120° angular intervals about the axis of the shaft 72.

Thus, the axial protrusions 134 prevent excessive upward movement of the rotor while not imposing undesirable excessive friction on the rotor 52 which would impede its rotation.

The outer housing 68 of assembled meter 100 retains the assembled top and bottom pieces of the bobbin 54 and 56 by an inward deformation 140 which is made at several places about the periphery of the housing. Furthermore, optional formed protrusions 142 serve to provide spacing between the assembled meter and the circuit card 70, or if electrically or mechanically affixed to the circuit card 70 may provide mechanical and/or electrical connection between the meter 50 and the circuit card 70.

Figure 3:
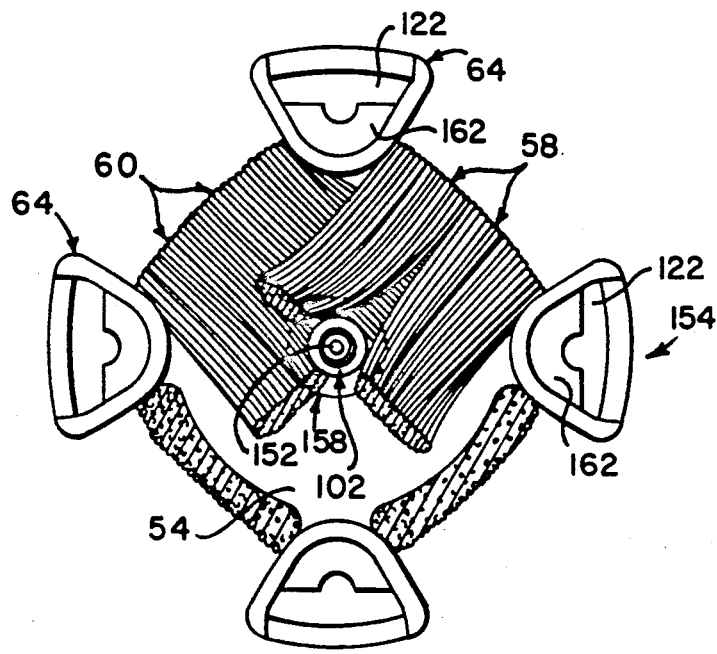
FIG. 3 is a plan view of the top piece of the bobbin according to the embodiment of the present invention shown in FIGS. 1 and 2.

A top plan view 154 of the bobbin top piece 54 is shown in FIG. 3 wherein the bobbin top piece 54 includes four posts 64 disposed radially outward from the axis 152 of the top piece 54, and includes smooth interior surfaces 156 which extend axially parallel to the axis 152, providing a smooth surface against which the wire of windings 58 and 60 may be wound. The inner shoulder on (coils) 58 of the elongated bearing 102 also forms a surface against which the windings 58 and 60 abut.

Figure 5:
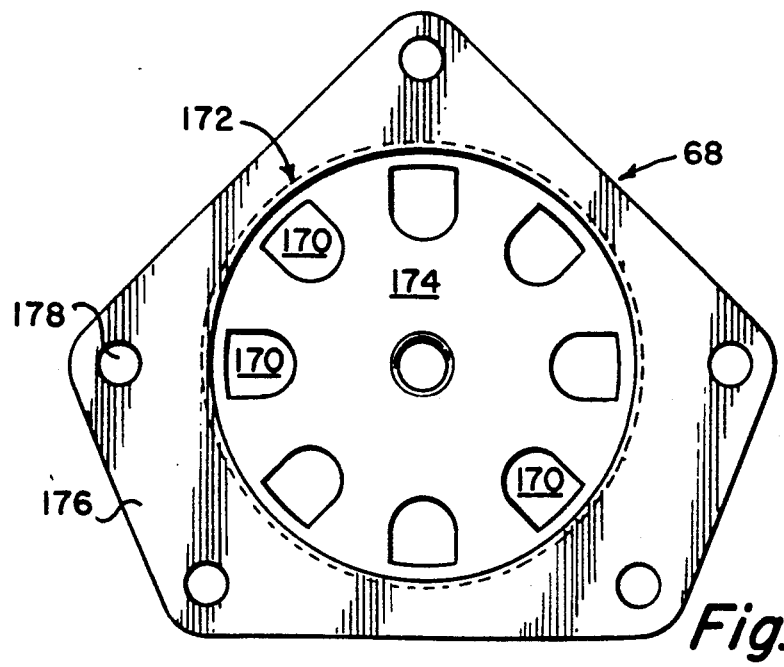
FIG. 5 is a plan view of the housing of the embodiment of the present invention illustrated in FIGS. 1 and 2.
Figure 4:
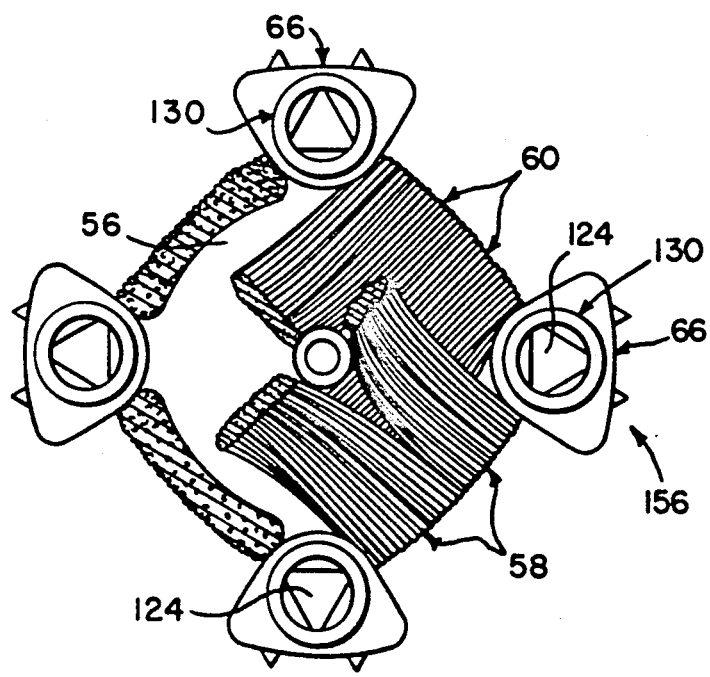
FIG. 4 is a plan view of the bottom piece of the bobbin according to the embodiment shown in FIGS. 1 and 2.

As previously discussed, the posts 64 include apertures 122 through which the pins 62 are received. The pins 62, not being axially uniform, extend through a portion of the aperture 162 to be seated on the lower piece 56 of the bobbin. A bottom plan view 156 of the bobbin 56 is shown in FIG. 4, wherein the posts 66 include apertures 124 to receive the pins 62. Also shown in FIG. 4 is the extension of the bobbin comprising an insulating shoulder 130 which extends through apertures 170 of the housing 68 as shown in the vertical plan view of FIG. 5. The housing 68 includes a cylindrical portion 172, having one or more apeeratures to provide dial ilumination from lamp (not shown), a lower perpendicular plane 174 extending inwardly from the surface of the cylinder 172 forming the rear of the housing 68 and having the apertures 170 thereon providing alternate angular alignments of the bobbin top and bottom pieces 54 and 56 with the housing 68. The housing 68 also includes an outward-extending front flange 176 which includes a plurality of holes 178 for attachment of a dial surface (not shown) on which the pointer 74 (FIG. 1) provides the desired angular rotations signal in response of angular indication.

Modifications and substitutions made by one of ordinary skill in the art are considered to be within the scope of the present invention which is not to be limited except by the claims which follow.

What is claimed is:

1. An air-core meter movement comprising,
a rotor having a shaft and magnet mounted thereon providing radially disposed magnetic poles and a planar surface perpendicular to the axis of said shaft;
a plurality of orthogonal windings;
a bobbin having a fluid-tight cavity therein and including an axially mating first and second bobbin piece, said first piece partially forming said cavity and having
a first axial bearing surface disposed on an extension axially disposed away from said second piece and adapted to receive said rotor shaft therethrough,
an axially extending protrusion extending inward toward said cavity and confronting said rotor planar surface,
a plurality of posts extending away from said second piece and disposed radially outward from said first axial bearing surface, each said post having rounded outer surfaces which includes at least a portion of a cylindrical surface having a radius of curvature relative to said first axial bearing surface, and each said post having an asymmetrical axial aperture therein which includes a radially outwardly disposed recess providing access and outward communication to said asymmetrical axial aperture, and
a protrusion disposed circumferential to said axis and extending toward said second piece and surrounding at least a portion of said cavity,
said second piece partially forming said cavity and having
a second axial bearing surface disposed away from said first piece and adapted to receive said rotor shaft therein,
a guide disposed circumferential to said axis and extending toward said first piece and being interposed between said cavity and said first piece protrusion,
a recess disposed circumferential to said axis and extending into said second piece away from said first piece and radially outward from said guide and adapted to receive said first piece protrusion, and
a plurality of posts extending outward from said first piece and disposed radially outward from said second axial bearing surface, each said post having rounded outer surfaces which includes at least a portion of a cylindrical surface having a radius of curvature relative to said second axial bearing surface, and each post having an aperture therein being at least axially offset from the corresponding aperture in said first piece post, and further including an axially extending reduced diameter portion having an outer dimension reduced from said post outer surface dimension and extending away from said first piece, wherein
said first and second pieces mate and engage to form a plurality of paths adapted to receive said plurality of orthogonal windings about said bearing surfaces and surround said cavity; and
a plurality of electrically conductive pins, each being received through said first and second piece apertures and having a mounting pin end received through said second piece, and an electrical termination end and an asymmetrical midsection received through said first piece, wherein,
said asymmetrical midsection axially seats against said second piece, and
said electrical termination end is adapted to receive a wire connection from one of said windings; and a cylindrical housing having,
a planar first portion at least partially occluding one end of said cylindrical housing, and including a plurality of apertures disposed therein, said cylindrical housing dimensioned to receive said axial extending reduced diameter portions at a plurality of relative alignment positions of said bobbin first and second pieces and said housing, said planar first portion further includes tab deformations extending from said first portion away from said cylindrical housing, and
a planar second portion extending radially outward from the other end of said cylindrical housing and having a plurality of spaced apertures therein, wherein said rotor shaft extends beyond said planar second portion.

2. The air-core meter of claim 1, wherein said rounded outer surfaces of each of said plurality of posts includes an aperture therein comprising a keyed aperture.

3. The air-core meter of claim 1, wherein said asymmetrical midsection of each of said conductive pins comprises an enlarged midsection relative to either end of said pin.

* * * * *